United States Patent
Day et al.

(10) Patent No.: US 6,812,156 B2
(45) Date of Patent: Nov. 2, 2004

(54) METHOD TO REDUCE RESIDUAL PARTICULATE CONTAMINATION IN CVD AND PVD SEMICONDUCTOR WAFER MANUFACTURING

(75) Inventors: Dyson Day, Kaohsiung (TW); Mei-Yen Li, Tainan (TW); Ming-Te More, Tainan (TW); Hsing-Yuan Chu, Shinying (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 137 days.

(21) Appl. No.: 10/188,490

(22) Filed: Jul. 2, 2002

(65) Prior Publication Data

US 2004/0005787 A1 Jan. 8, 2004

(51) Int. Cl.[7] ............................................. H01L 21/302
(52) U.S. Cl. ........................ 438/745; 438/750; 438/754; 134/1.1; 134/1.2
(58) Field of Search ................................. 438/745, 750, 438/754, 756; 427/123, 261; 134/1.1, 1.2, 1.3

(56) References Cited

U.S. PATENT DOCUMENTS

| | | | | |
|---|---|---|---|---|
| 4,820,393 A | * | 4/1989 | Brat et al. | 204/192.15 |
| 5,934,566 A | * | 8/1999 | Kanno et al. | 239/398 |
| 6,432,836 B1 | * | 8/2002 | Watanabe | 438/745 |
| 6,598,610 B2 | * | 7/2003 | Blain et al. | 134/1.1 |
| 6,645,550 B1 | * | 11/2003 | Cheung et al. | 427/123 |

* cited by examiner

*Primary Examiner*—Lan Vinh
(74) *Attorney, Agent, or Firm*—Tung & Associates

(57) ABSTRACT

A method of reducing particulate contamination in a deposition process including providing a semiconductor wafer having a process surface for depositing a deposition layer thereover according to one of a physical vapor deposition (PVD) and a chemical vapor deposition (CVD) process; depositing at least a portion of the deposition layer over the process surface; cleaning the semiconductor wafer including the process surface according to an ex-situ cleaning process to remove particulate contamination including at least one of spraying and scrubbing; and, repeating the steps of depositing and cleaning at least once to include reducing a level of occluded particulates.

21 Claims, 2 Drawing Sheets

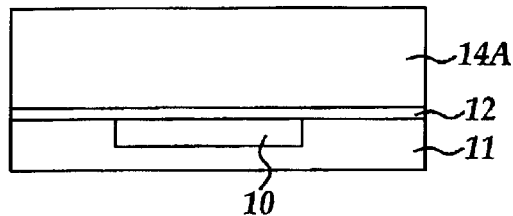
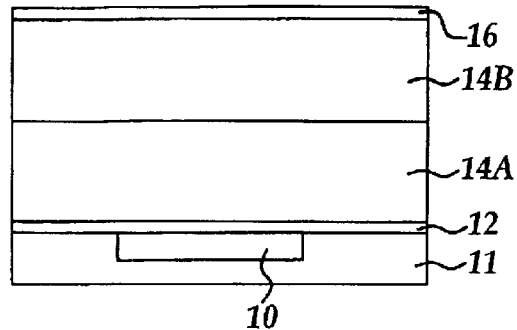
Figure 1A  Figure 1B
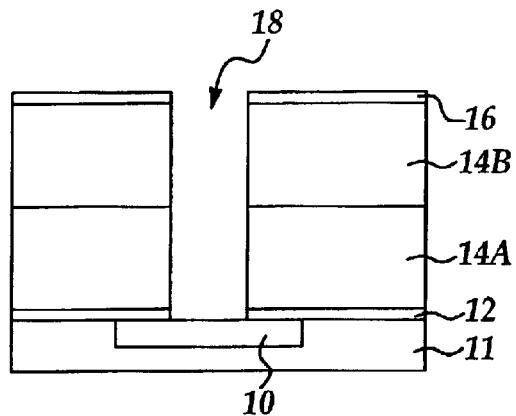
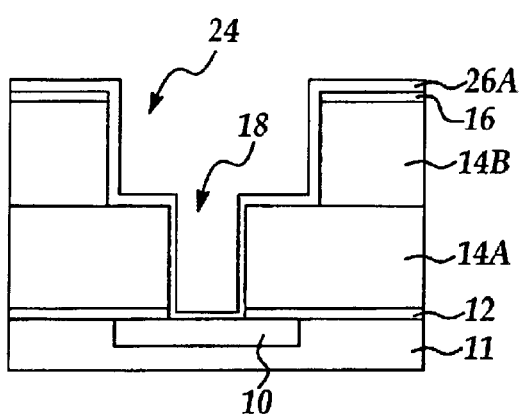
Figure 1C  Figure 1D
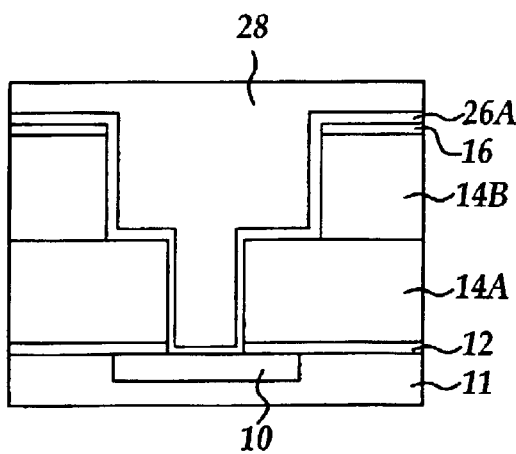
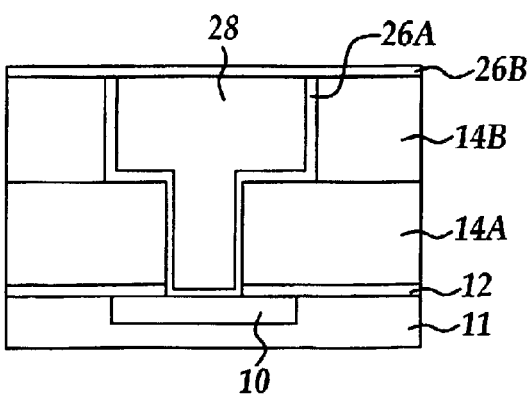
Figure 1E  Figure 1F

METHOD TO REDUCE RESIDUAL PARTICULATE CONTAMINATION IN CVD AND PVD SEMICONDUCTOR WAFER MANUFACTURING

FIELD OF THE INVENTION

This invention generally relates to semiconductor wafer manufacturing and more particularly to methods for depositing PVD and CVD layers to reduce particulate contamination.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

For example, in creating a multiple layer semiconductor device on a semiconductor wafer, each layer making up the device may be subjected to one or more deposition processes, for example using chemical vapor deposition (CVD) or physical vapor deposition (PVD), and usually including one or more etching procedures by either a dry (plasma) or wet (chemical) etching process. A critical condition in semiconductor manufacturing is the absence of contaminants on the wafer processing surface, since contaminants including, for example, microscopic particles, may interfere with and adversely affect subsequent processing steps leading to device degradation and ultimately semiconductor wafer rejection.

While the wafer cleaning process has always been a critical step in the semiconductor wafer manufacturing process, ultra clean wafers are becoming even more critical to device integrity. For example, as semiconductor feature sizes decrease, the detrimental effect of particle contamination increases, requiring removal of ever smaller particles. For example, particles as small as 5 nm may be unacceptable in many semiconductor manufacturing processes. Further, as the number of device layers increases, for example to 5 to 8 layers, there is a corresponding increase in the number of cleaning steps and the potential for device degradation caused by contamination. To adequately meet requirements for ultra clean wafers in ULSI and VLSI the wafer surface must be free of contaminating particles.

Another factor in modern processing technology that increases the incidence of particle contamination is the deposition of carbon doped oxides as IMD layers to achieve dielectric constants of less than about 3.0. The IMD layers are typically deposited by a plasma enhanced CVD (PECVD), low pressure CVD (LPCVD) or high density plasma CVD (HDP-CVD). In theses processes, a degree of sputtering occurs as the layer of material is deposited causing a higher degree of particulate contamination as the deposition time increases. In addition PVD processes are typically used to deposit films of metal, for example barrier/adhesion layers within anisotropically etched features or for metal filling an anisotropically etched feature. PVD processes tend to coat the inner surfaces of the processing chamber with a metal film, flaking off to contaminate a wafer process surface as the metal film increases in thickness and are subjected to cyclic thermal stresses. Again, the degree of particulate contamination depositing on the process surface increases with the thickness of the film being deposited.

Common processes in use for cleaning wafers include cleaning solutions based on hydrogen peroxide. At high pH values (basic) organic contamination and oxidizable particles, are removed by an oxidation process. At low pH (acidic) metal contamination is desorbed from the water surface by forming a soluble complex.

Typically, to reduce processing times and increase throughput, in prior at processes, an ex-situ cleaning process is performed following film deposition. For example, common particle removal mechanisms which may be exploited, depending on the particle and how it adheres to the surface, include dissolution, oxidizing degradation and dissolution, physical removal by etching, and electrical repulsion between a particle and the wafer surface.

Standard wafer cleaning processes include mechanical scrubbing and ultrasonic agitation of the wafer surface in a cleaning solution or in deionized water to effectuate particulate removal.

One shortcoming with the prior art method for depositing CVD and PVD layers making up a semiconductor device is that particulates may accumulate within the deposited layer producing defects including voids and particle inclusions that are difficult to detect following deposition. For example, automated optical scanning methods are typically used to detect and count particulate contamination at the wafer process surface following film deposition. Unfortunately, the effect of included particles may not be detected until several manufacturing processes have been performed and the process wafer fails wafer acceptance testing (WAT). The effect of the particulate inclusions may not manifest itself for a period of time, but increases reliability concerns of the semiconductor device. For example, the included particles may form localized areas of high stress increasing the probability of crack initiation during subsequent stress inducing manufacturing processes or environmentally induced stresses including, for example thermal cycling stresses. As a result, device yield and reliability is adversely affected.

There is therefore a need in the semiconductor processing art to develop a method whereby the incidence of particulate contamination during PVD or CVD processes is reduced.

It is therefore an object of the invention to develop a method whereby the incidence of particulate contamination during PVD or CVD processes is reduced, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of reducing particulate contamination in a deposition process.

In a first embodiment, the method includes providing a semiconductor wafer having a process surface for depositing a deposition layer thereover according to one of a physical vapor deposition (PVD) and a chemical vapor deposition (CVD) process; depositing at least a portion of the deposition layer over the process surface; cleaning the semiconductor wafer including the process surface according to an ex-situ cleaning process to remove particulate contamination including at least one of spraying and scrubbing; and, repeating the steps of depositing and cleaning at least once to include reducing a level of occluded particulates.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 1A–1F are representative cross sectional side views of a portion of a semiconductor wafer at stages in an exemplary semiconductor feature manufacturing process according to an embodiment of the present invention.

FIG. 2B is a schematic representation of a cross sectional side view of an exemplary ultrasonic scrubbing apparatus for use in the ex-situ cleaning process according to an embodiment of the present invention.

FIG. 2C is a schematic representation of a cross sectional side view of an exemplary mechanical scrubbing apparatus for use in the ex-situ cleaning process according to an embodiment of the present invention.

DETAILED DESCRIPTION OF THE PREFERRED EMBODIMENTS

Figure 2A:
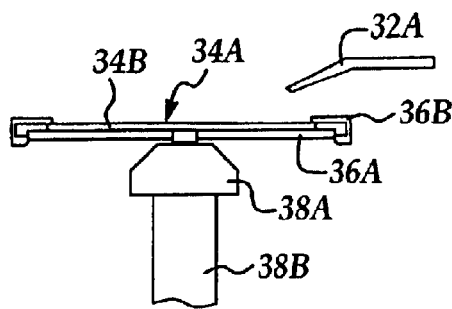
FIG. 2A is a schematic representation of a cross sectional side view of an exemplary spin/spray apparatus for use in the ex-situ cleaning process according to an embodiment of the present invention.

Although the method of the present invention is explained by reference to an exemplary semiconductor manufacturing process for formation of a dual damascene structure, it will be appreciated that the method of the present invention is applicable to all semiconductor manufacturing processes where chemical vapor deposition (CVD) and physical vapor deposition (PCD) processes may advantageously be performed to reduce particulate contamination within and on the surface of deposited layers, for example, including contact pads.

In a first embodiment of the invention, a semiconductor wafer process surface is provided for depositing a deposition layer according to at least one of a CVD or PVD deposition process. The deposition layer is deposited according to a multi-step process whereby a first portion of the deposition layer is deposited followed by ex-situ particulate cleaning of the wafer process surface to include removing particulate contamination. The deposition process and the ex-situ particulate cleaning process are then repeated at least once to complete the formation of the deposition layer.

The CVD process includes, for example, plasma enhanced CVD (PECVD), low pressure CVD (LPCVD), atmospheric pressure CVD (APCVD), and high density plasma CVD (HDP-CVD). The PVD process includes any PVD process including, for example, collimated sputtering (CS), ionized magnetron sputtering (IMS), and ion metal plasma (IMP).

In one embodiment, the deposition layer is a dielectric insulating layer, including, for example silicon dioxide, carbon doped oxide (C-oxide), organo-silicate glass (OSG), undoped silicate glass (USG), and fluorinated silicate glass (FSG). For example, precursors including tetra-methyl-silane (4MS), trimethyl-silane (3MS), and other organo-silane precursors adaptable to CVD deposition are suitably used.

In another embodiment, the deposition layer is a metal layer, including for example titanium, tungsten, tantalum, aluminum, and copper or alloys thereof. The deposition layer may include a silicidation or nitridization process following the metal deposition process as is known in the art. For example, the deposition layer may include a first titanium portion, followed by nitridization to form titanium nitride (e.g., TiN) for a diffusion barrier layer, followed by an ex-situ cleaning process prior to forming a second deposition layer of, for example, an aluminum:copper alloy, followed by a second ex-situ cleaning process, followed by a third deposition layer of, for example, another titanium nitride diffusion barrier layer.

In another embodiment, the ex-situ cleaning process includes at least one of ultrasonic scrubbing, a high pressure spray/scrub process including a high pressure jet of cleaning fluid sprayed on the wafer surface with simultaneous mechanical scrubbing, and a spin/spray process including a high pressure jet of cleaning fluid swept over the wafer rotating at speeds of about 200 to about 1000 rpm.

Preferably, the multi-step deposition process includes depositing the first portion of the dielectric insulating layer to a thickness of between about 500 Angstroms and about 4000 Angstroms. Since particulate accumulation increases with layer thickness, a thinner portion of a deposited layer is preferred, for example about 1000 Angstroms to about 3000 Angstroms, after which the ex-situ particulate cleaning process is performed prior to forming another portion of the dielectric insulating layer.

In a typical damascene process, for example, a dual damascene manufacturing process known in the art as a via-first-trench last process, a conventional photolithographic process using a photoresist layer is first used to expose and pattern a metal nitride etching mask overlying an insulating (IMD/ILD) layer for etching via openings through the insulating layer. Subsequently a similar process is used to define trench openings that are formed overlying and preferably substantially encompassing the via openings. The via openings and trench openings are subsequently filled with metal, for example copper, to form vias and trench lines. The surface may then be planarized by conventional techniques to remove excess metal over the process surface and prepare the process surface for further processing.

Referring to FIGS. 1A–1F, are shown cross sectional side views of portions of a semiconductor wafer at stages in an exemplary semiconductor manufacturing process for producing a dual damascene structure. Referring to FIG. 1A is shown a substrate having a first conductive layer 10, for example copper or aluminum, formed in dielectric insulating layer 11. Thereafter, a metal nitride etching stop layer 12 of, for example, silicon nitride, silicon oxynitride, or silicon carbide is deposited over the dielectric insulating layer 11 by a conventional CVD process such as LPCVD, PECVD, or HDP-CVD. The etching stop layer 12 is deposited to a thickness of about 200 to about 1000 Angstroms.

According to one aspect of the invention, following the deposition of the etching stop layer 12, the semiconductor wafer is subjected to an ex-situ wafer cleaning process according to preferred embodiments to remove particulate contaminants including residual particles remaining on the semiconductor wafer surface. Next, a first dielectric insulating layer portion 14A is formed over the etching stop layer 12 by, for example, a PECVD process. For example, the dielectric insulating layer is a carbon doped oxide formed to a thickness of about 2000 to 3000 Angstroms. Following the deposition of first dielectric insulating layer portion 14A, the semiconductor wafer is subjected to another ex-situ wafer cleaning process according to preferred embodiments to remove particulate contaminants including residual particles remaining on the semiconductor wafer surface to reduce the level of occluded particulate contaminants in the final dielectric insulating layer thickness.

Referring to FIG. 1B, following the ex-situ cleaning process, a second dielectric insulating layer portion 14B is deposited to a thickness about equal to the first dielectric insulating layer portion 14A followed by another ex-situ cleaning process to complete the formation of the dielectric insulating layer e.g., 14A, 14B.

Still referring to FIG. 1B, following formation of the dielectric insulating layer, e.g., 14A, 14B, a capping layer or second etching stop layer 16 of, for example, silicon nitride, silicon oxynitride, or silicon carbide is deposited over the dielectric insulating layer 14B in the same manner and thickness as the first etching stop layer 12. Preferably, a dielectric anti-reflectance coating (DARC) layer (not shown), for example, silicon oxynitride or titanium nitride, is formed over the etching stop layer 16 to reduce undesired light reflections from the surface and underlying interfaces in a subsequent photolithographic process. Preferably, the semiconductor wafer is then subjected to another ex-situ wafer cleaning process to remove contaminants including residual metal nitride particles from the process surface.

Referring to FIG. 1C, a photoresist layer (not shown) is deposited over the etching stop layer 16 to photolithographically pattern an etching area to anisotropically etch according to a conventional reactive ion etching (RIE) process through the etching stop layer 16, and the dielectric insulating layers 14A and 14B to form via opening 18 in closed communication with underlying conductive area 10.

Referring to FIG. 1D, after etching via opening 18, the photoresist layer (not shown) is stripped and the photolithographic patterning and etching process is repeated to form a trench line opening 24 overlying and encompassing via opening 18. A metal nitride barrier diffusion layer 26A, for example, a refractory metal nitride such as tantalum nitride or titanium nitride is deposited by either a conventional PVD process or a CVD process to line the side walls and bottom of the via and trench line openings. For example, if the via and trench line openings are filled with an aluminum:copper alloy according to a PVD process, the barrier diffusion layer 26A is preferably titanium nitride deposited according to a conventional PVD process followed by nitridization or deposited by a conventional CVD process. Alternatively, if the via and trench line openings are filled with copper according to an electrodeposition process, the barrier diffusion layer 26A is preferably formed of tantalum nitride deposited according to a conventional PVD process followed by nitridization or deposited by a conventional CVD process. According to either the CVD or PVD process, the process wafer is preferably subjected to the ex-situ cleaning process following the PVD or CVD process to remove contaminants including particulates at the wafer surfaces.

Referring to FIG. 1E, following deposition of the barrier diffusion layer 26A and the ex-situ cleaning process the via and trench line openings are filled with metal by depositing metal layer 28. For example, where an aluminum:copper alloy is used, a conventional PVD process, for example using an ion metal plasma (IMP) may be carried out. Following the PVD metal deposition process, the process wafer is preferably subjected to the ex-situ cleaning process according to preferred embodiments to remove contaminants including particulates at the wafer surfaces.

Referring to FIG. 1F, in one approach, following metal filling of the via and trench line openings, the process wafer surface is preferably subjected to a chemical mechanical polishing (CMP) process to planarize the process wafer surface to remove excess deposited metal to include removing at least a portion of the etching stop layer 16 (shown removed). Following the CMP process a second barrier diffusion layer 26B of, for example titanium nitride, is deposited according to a conventional PVD deposition process to deposit titanium followed by a nitridization process to form titanium nitride. Alternatively, a conventional CVD process to form the titanium nitride layer may be used. Following formation of the titanium nitride layer according to either a PVD or CVD process another ex-situ cleaning process according to preferred embodiments is carried out.

Preferably, the cleaning solution used in the ex-situ cleaning process includes at least one of a solution of hydrogen peroxide ($H_2O_2$) and sulfuric acid ($H_2SO_4$), a solution of hydrogen peroxide with choline (($CH_3)_3N(CH_2CH_2OH$) OH), a solution of $H_2O_2$ and $NH_4OH$ and a solution of $H_2O_2$ and HCl, a solution of a carboxylic group containing acid, such as citric acid, and deionized water. Preferably, after applying the cleaning solution, the cleaning process is followed by a deionized water rinse and spin dry. Other carboxylic cleaning solutions suitably include formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

Referring to FIG. 2A, in one embodiment, the ex-situ cleaning process includes simultaneously rotating the wafer while a high pressure jet of cleaning fluid is sprayed on the process surface. For example, one or more jet spray nozzles e.g., 32A sweep a spray of pressurized cleaning fluid over the wafer process surface 34A of wafer 34B which is mounted on wafer pedestal 36A which includes clamping means e.g., 36B at the periphery of the wafer 34B to help hold the wafer in place while wafer pedestal 36A attached to rotatable shaft(not shown) housed in shaft housings 38A and 38B is rotated by a variable speed motor (not shown). In operation, for example the pressurized spray of cleaning fluid is preferably about 10 PSI to about 20 PSI and is swept over the process surface of the wafer preferably rotated at speeds of about 200 to about 1000 rpm.

Referring to FIG. 2B, in another embodiment, a conventional sonic cleaning procedure referred to as a megasonic cleaning process is used as the sonic cleaning process which includes a transducer e.g., 208 producing sonic energy at a frequency of about 850 to 900 kHz. The sonic energy is preferably directed parallel to the semiconductor wafer surfaces. For example, semiconductor wafer surfaces e.g., 202 held in cassette 203, are immersed in cleaning solution 204 such that semiconductor wafer surfaces e.g., 202 are oriented parallel to the direction of travel of the sonic waves e.g., 206 produced by the transducer 208, typically mounted against the outside of a cleaning solution container 210. Fresh cleaning solution may be added at the top portion of container 210 through solution supply feeds e.g., 212. Both automated megasonic cleaning devices and automated mechanical brushing devices are commercially available. It will be appreciated that any conventional mechanical brushing device and megasonic cleaning device may be utilized according to the present invention. Preferably, the mechanical brushing cleaning procedure and the megasonic cleaning procedure according to the present invention, may be performed either separately or together, and are each carried out for a period of from about 30 to 120 seconds and more preferably about 45 seconds, depending on the particular mechanical brushing procedure and the megasonic cleaning procedure used.

According to the present invention, the mechanical brushing procedure may be applied to one or both of the semiconductor surfaces, for example the process surface and the backside surface, but preferably is applied to both surfaces. The mechanical brushing may be applied by any conventional brush equipped with bristles that will not damage the surface such as a plastic material including, for example, a porous polyvinyl acetyl (PVA). Preferably the PVA bristles have a porosity of from about 85 percent to about 95 percent. However, other materials such as nylon, mohair or a polishing pad material can be used. Suitable pressures applied by the brushes to the wafer surface may be within a range of 1 PSI to about 10 PSI, but are preferably about 5 PSI.

Referring to FIG. 2C is shown an exemplary mechanical brushing process where the mechanical brushing action on the semiconductor surface is preferably supplied by a rotary type brush either immersed in the cleaning solution or equipped with commercially available brushes that include a spraying source for spraying the cleaning solution onto the wafer surfaces. For example, both semiconductor wafer surfaces e.g., 220A and 220B may be contacted with one or more rotary brushes e.g., 222A and 222B while the semiconductor wafer surfaces are, for example, mounted on rollers 224A and 224B with the water oriented for example, horizontally, such that both the rotary brushes, e.g., 222A and 222B, and the semiconductor wafer simultaneously rotate to allow for the entire wafer surface to be brushed. The wafer may either be immersed in the cleaning solution or have the cleaning solution supplied by cleaning solution feeds located near the wafer surface or included as part of the brushing fixture. The wafer may further be optionally oriented in other directions such as vertically with rotary brushes contacting the top and bottom surfaces of the wafer while the wafer is rotated. It will be further appreciated that other types of brushing action, such as vertically directed or horizontally directed may be advantageously used according to the present invention.

Figure 3A:
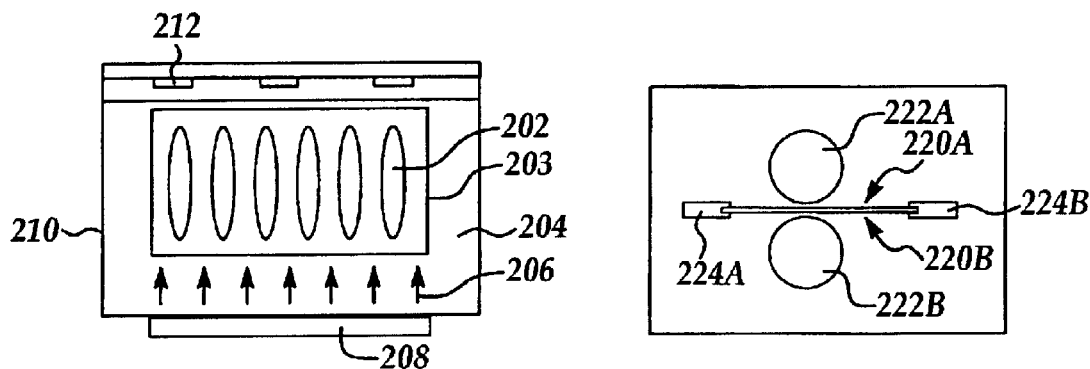
FIGS. 3A and 3B are process flow diagrams of including embodiments according to the present invention.
Figure 3A:
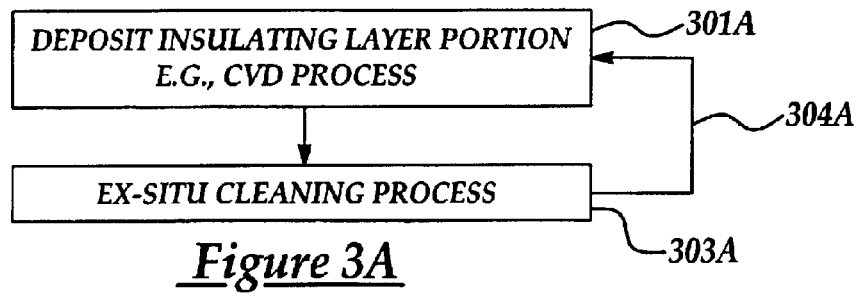

Referring to FIG. 3A is a process flow diagram including several embodiments of the present invention. In process 301A a first portion of a dielectric insulating layer is deposited by a CVD deposition process. In process 303A an ex-situ cleaning process according to the preferred embodiments of the present invention is carried out. As indicated by directional process arrow 304A, the deposition process and ex-situ cleaning process is repeated from about 1 to about 3 times to complete a deposition of the dielectric insulating layer.

Figure 3B:
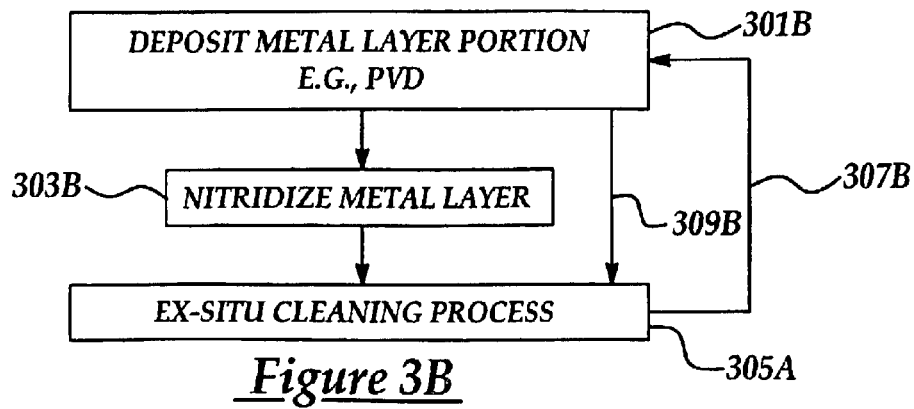

Referring to FIG. 3B is a process flow diagram including another embodiment of the present invention. In process 301B a first portion of a deposition layer, for example, a metal layer is deposited by a PVD metal deposition process followed by a metal nitridization process 303B to form a metal nitride. Alternatively, as indicated by directional process arrow 309B an ex-situ cleaning process is carried out following the metal layer deposition. In process 305B an ex-situ cleaning process according to the preferred embodiments of the present invention is carried out. As indicated by directional process arrow 307B the PVD metal deposition process 301B and nitridization process 303B followed by the ex-situ cleaning process 305B may be repeated. Alternatively, as indicated by directional process arrow 309B an ex-situ cleaning process is carried out following the metal layer deposition.

It will be appreciated that a CVD deposition process and a PVD deposition process may be sequentially carried out in any order and multiple layers may be deposited according to the present invention provided an ex-situ cleaning process follows each of the deposition processes.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of reducing occluded particulate contamination in a PVD or CVD deposition process comprising the steps of:

providing a semiconductor wafer having a process surface for depositing a deposition layer thereover;

depositing a portion of the deposition layer over the process surface according to a process selected from the group consisting of a physical vapor deposition (PVD) and a chemical vapor deposition (CVD) process;

cleaning the deposition layer according to an ex-situ cleaning process to remove particulate contamination comprising at least one of spraying and scrubbing; and, repeating the steps of depositing and cleaning at least once to complete the deposition layer.

2. The method of claim 1, wherein the deposition layer comprises a metal nitride layer and an overlying metal layer.

3. The method of claim 1, wherein the scrubbing process is selected from the group consisting of ultrasonic scrubbing and mechanical scrubbing.

4. The method of claim 1, wherein the spraying process comprises a pressurized spray source simultaneously sprayed onto the process surface while rotating the semiconductor wafer.

5. The method of claim 1, wherein the portion comprises from about ¼ to about ½ of a final deposition layer thickness.

6. The method of claim 1, wherein the ex-situ cleaning process comprises a cleaning solution selected from the group consisting of a solution of hydrogen peroxide ($H_2O_2$) and sulfuric acid ($H_2SO_4$), a solution of hydrogen peroxide with choline (($CH_3$)$_3$N($CH_2CH_2OH$)OH), a solution of $H_2O_2$ and $NH_4OH$, a solution of $H_2O_2$ and HCl, and a solution of a carboxylic group containing acid and deionized water.

7. The method of claim 6, wherein the carboxylic group containing acid is selected from the group consisting of formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

8. The method of claim 6, wherein the cleaning solution temperature is from about 20 degrees Centigrade to about 90 degrees Centigrade.

9. The method of claim 1, wherein the deposition layer comprises a dielectric insulating layer.

10. The method of claim 9, wherein the dielectric insulating layer comprises a material selected from the group consisting of silicon dioxide, carbon doped oxide (C-oxide), organo silicate glass (OSG), undoped silicate glass (USG), and fluorinated silicate glass (FSG).

11. The method of claim 9, wherein the step of repeating is carried out from about 1 to about 3 times.

12. A method of reducing occluded particulate contamination in a deposition layer following a CVD or PVD deposition process comprising the steps of:

providing a semiconductor wafer having a process surface for depositing a dielectric insulating layer;

depositing a portion of the dielectric insulating layer from about ¼ to about ½ of a final dielectric insulating layer thickness according to a PECVD process over the process surface;

cleaning the dielectric insulating layer according to an ex-situ cleaning process to remove particulate contamination comprising at least one of spraying and scrubbing; and, repeating the steps of depositing and cleaning to complete the final dielectric insulating layer thickness.

13. The method of claim 12, wherein the dielectric insulating layer comprises a material selected from the group consisting of silicon dioxide, carbon doped oxide (C-oxide), organo silicate glass (OSG), undoped silicate glass (USG), and fluorinated silicate glass (FSG).

14. The method of claim 12, wherein the step of repeating is carried out from about 1 to about 3 times to deposit about equal dielectric insulating layer portion thicknesses.

15. The method of claim 12, wherein the scrubbing process is selected from the group consisting of ultrasonic scrubbing and mechanical brushing.

16. The method of claim 12, wherein the spraying process comprises a pressurized spray source simultaneously sprayed to sweep over the process surface while rotating the semiconductor wafer.

17. The method of claim 12, further comprising the steps of:

forming a damascene opening in the dielectric insulating layer;

forming a metal nitride barrier layer;

carrying out the ex-situ cleaning process; and, backfilling the damascene opening with metal.

18. The method of claim 17, further comprising the steps of:

planarizing the metal filled damascene opening;

forming a metal nitride layer on the metal filled damascene opening; and, carrying out the ex-situ cleaning process.

19. The method of claim 12, wherein the ex-situ cleaning process comprises a cleaning solution selected from the group consisting of a solution of hydrogen peroxide ($H_2O_2$) and sulfuric acid ($H_2SO_4$), a solution of hydrogen peroxide with choline (($CH_3)_3N(CH_2CH_2OH)OH$), a solution of $H_2O_2$ and $NH_4OH$, a solution of $H_2O_2$ and $HCl$, and a solution of a carboxylic group containing acid and deionized water.

20. The method of claim 19, wherein the carboxylic group containing acid is selected from the group consisting of formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

21. The method of claim 19, wherein the cleaning solution temperature is from about 20 degrees Centigrade to about 90 degrees Centigrade.

* * * * *